United States Patent
Chhabra

(10) Patent No.: US 9,559,665 B2
(45) Date of Patent: Jan. 31, 2017

(54) ULTRA-LOW VOLTAGE TEMPERATURE THRESHOLD DETECTOR

(71) Applicant: STMicroelectronics International N.V., Schiphol (NL)

(72) Inventor: Amit Chhabra, Delhi (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 14/788,714

(22) Filed: Jun. 30, 2015

(65) Prior Publication Data
US 2017/0005641 A1    Jan. 5, 2017

(51) Int. Cl.
H03K 3/011    (2006.01)
G11C 11/417   (2006.01)
H03K 17/687   (2006.01)
H01L 27/11    (2006.01)

(52) U.S. Cl.
CPC ............ H03K 3/011 (2013.01); G11C 11/417 (2013.01); H01L 27/1104 (2013.01); H03K 17/687 (2013.01)

(58) Field of Classification Search
CPC ............ H01L 27/1203; H01L 27/0928; G11C 11/412; G11C 11/4074; G11C 29/83; G11C 5/146
See application file for complete search history.

(56) References Cited

U.S. PATENT DOCUMENTS

| | | | | |
|---|---|---|---|---|
| 5,559,368 A * | 9/1996 | Hu | ......................... | H01L 27/092 257/351 |
| 6,593,799 B2 * | 7/2003 | De | ....................... | H01L 27/0928 257/E27.067 |
| 7,112,997 B1 * | 9/2006 | Liang | .................. | G06F 17/5054 257/E21.703 |
| 7,227,804 B1 * | 6/2007 | Kothandaraman | .... | G11C 5/147 365/189.06 |
| 7,498,637 B2 * | 3/2009 | Yamaoka | .............. | G11C 11/412 257/350 |
| 7,732,864 B2 * | 6/2010 | Kawahara | ........... | H01L 27/1203 257/206 |
| 8,816,754 B1 * | 8/2014 | Clark | ................... | H03K 17/145 327/534 |
| 2004/0014268 A1 * | 1/2004 | Ishibashi | ............. | H01L 27/0218 438/200 |
| 2010/0110786 A1 * | 5/2010 | Kang | ....................... | G11C 7/04 365/185.2 |

(Continued)

OTHER PUBLICATIONS

Arabi et al., "Built-In Temperature Sensors for On-line Thermal Monitoring of Microelectronic Structures," IEEE International Conference on Computer Design: VLSI in Computers and Processors (ICCD), Austin, TX, Oct. 12-15, 1997, pp. 462-467.

(Continued)

Primary Examiner — Hoai V Ho
Assistant Examiner — Roberto Mancera
(74) Attorney, Agent, or Firm — Seed IP Law Group LLP

(57) ABSTRACT

An integrated circuit die includes a plurality of transistors formed in a semiconductor substrate, the body regions of the transistors on a doped well region of the semiconductor substrate. A threshold detector selectively applies either a first voltage or second voltage to the doped well region based on whether the temperature of the semiconductor substrate is above or below a threshold temperature.

17 Claims, 9 Drawing Sheets

(56) References Cited

U.S. PATENT DOCUMENTS

2014/0159806 A1* 6/2014 Kim .................. G05F 3/205
327/537
2015/0280702 A1* 10/2015 Walker ................ G01K 7/16
327/543

OTHER PUBLICATIONS

Chen et al., "A Time-to-Digital-Converter-Based CMOS Smart Temperature Sensor," *IEEE Journal of Solid-State Circuits* 40(8):1642-1648, Aug. 2005.

Chen et al., "A Fully Digital Time-Domain Smart Temperature Sensor Realized With 140 FPGA Logic Elements," *IEEE Transactions on Circuits and Systems—I: Regular Papers* 54(12):2661-2668, Dec. 2007.

Chen et al., "A Time-Domain SAR Smart Temperature Sensor With Curvature Compensation and a 3σ Inaccuracy of −0.4° C. ~+0.6° C. Over a 0° C. to 90° C. Range," *IEEE Journal of Solid-State Circuits* 45(3):600-609, Mar. 2010.

Chung et al., "An Autocalibrated All-Digital Temperature Sensor for On-Chip Thermal Monitoring," *IEEE Transactions on Circuits and Systems—II: Express Briefs* 58(2):105-109, Feb. 2011.

Datta et al., "Low-Power and Robust On-Chip Thermal Sensing Using Differential Ring Oscillators," 50th Midwest Symposium on Circuits and Systems (MWSCAS), Montreal, Que., Aug. 5-8, 2007, pp. 29-32.

Datta et al., "A 12.4μm$^2$ 133.4μW 4.56mV/°C. Resolution Digital On-Chip Thermal Sensing Circuit in 45nm CMOS Utilizing Sub-Threshold Operation," 12th International Symposium on Quality Electronic Design (ISQED), Santa Clara, CA, Mar. 14-16, 2011, 7 pages.

Kaxiras et al., "4T-Decay Sensors: A New Class of Small, Fast, Robust, and Low-Power, Temperature/Leakage Sensors," Proceedings of the 2004 International Symposium on Low Power Electronics and Design (ISLPED), Newport Beach, CA, Aug. 2004, pp. 108-113.

Li et al., "Efficient Full-Chip Thermal Modeling and Analysis," IEEE/ACM International Conference on Computer Aided Design (ICCAD), Nov. 7-11, 2004, pp. 319-326.

Pertijs et al., "A CMOS Smart Temperature Sensor With a 3σ Inaccuracy of ±0.1° C. From −55° C. to 125° C.," *IEEE Journal of Solid-State Circuits* 40(12):2805-2815, Dec. 2005.

Székely et al., "CMOS Sensors for On-Line Thermal Monitoring of VLSI Circuits," *IEEE Transactions on Very Large Scale Integration (VLSI) Systems* 5(3):270-276, Sep. 1997.

\* cited by examiner

ULTRA-LOW VOLTAGE TEMPERATURE THRESHOLD DETECTOR

BACKGROUND

Technical Field

The present disclosure relates to the field of integrated circuit dies and, more particularly, to sensing temperatures in an integrated circuit die.

Description of the Related Art

Many types of electronic devices include integrated circuit dies. The integrated circuit dies can include millions or even billions of transistors. As the number of transistors increases, so too can the power consumed by the integrated circuit die. Handheld or other portable electronic devices typically are powered by one or more batteries. The higher the rate of power consumption, the more quickly the batteries become depleted. Thus, many schemes have been devised to reduce the rate of power consumption.

One way to reduce power consumption in an electronic device is to lower the operating voltage. In devices that include an SRAM array, the minimum operating voltage of the SRAM array can become a limiting factor in reducing the operating voltage. This is because at low voltages, the temperature of the semiconductor substrate can affect the reliability of both read and write operations of the SRAM. In particular, SRAM bit cells can have conflicting requirements for read and write operations with regard to temperature and operating voltage.

Each SRAM bit cell typically includes both NMOS and PMOS transistors. The threshold voltage of both NMOS and PMOS transistors increases with decreasing temperature. Higher temperatures can lead to an increase in failures during read operations, i.e., destructive reads, or flipping of stored data during read operations from an SRAM bit cell. Conversely, lower temperatures can lead to an increase in failures during write operations. This effect of temperature is generally predominant at low voltage operation of the SRAM bit cell.

BRIEF SUMMARY

One embodiment is an integrated circuit die that compensates for the effects of temperature variation on the operation of an SRAM array by detecting the temperature of a semiconductor substrate of the integrated circuit die and selectively applying a first or a second bias voltage to the body regions of transistors of the SRAM array based on whether the temperature of the semiconductor substrate is above or below a threshold temperature. In this way, an appropriate body bias voltage can be selectively applied to the body regions of the transistors based on whether the temperature of the semiconductor substrate is above or below a threshold voltage. This can improve the reliability of the SRAM by reducing errors during read and write operations of the SRAM.

In one embodiment, the integrated circuit die includes a semiconductor substrate, a doped well region positioned in the semiconductor substrate, and an SRAM array including a plurality of transistors having body regions positioned in the doped well region. Further, the doped well region can be common for the NMOS and PMOS devices of the SRAM array in fully depleted silicon on insulator (FDSOI) technology including planar and FinFET devices. The integrated circuit die further includes a threshold temperature detector that detects the temperature of the doped well region and supplies a high supply voltage to the doped well region when the semiconductor substrate is below the threshold temperature and supplies a ground voltage to the doped well region when the semiconductor substrate is above the doped well region.

In one embodiment the threshold temperature detector includes a plurality of transistors coupled together in a detection arrangement between the high supply voltage and ground. An output node of the detection circuit outputs either the high supply voltage or ground based on the threshold voltages of the transistors. Because the threshold voltages of the transistors vary with temperature, as the temperature of the semiconductor substrate changes, the threshold voltages of the transistors also change. As the temperature crosses the threshold temperature, the output node is forced to either the high supply voltage or ground as the case may be. In this way, the temperature detection circuit outputs either the high supply voltage or ground based on the threshold temperature.

The principles of selectively applying a body bias voltage based on a threshold temperature are also extended to applications other than SRAMs.

DETAILED DESCRIPTION

Figure 1:
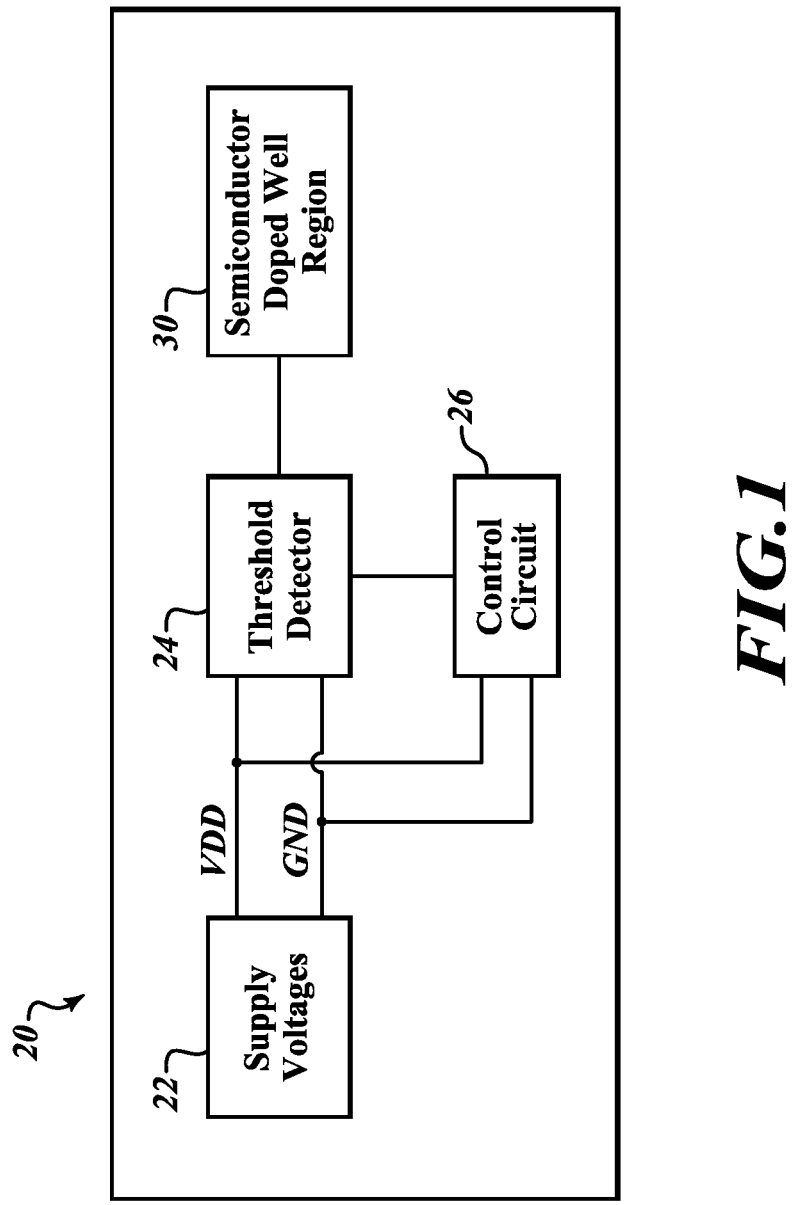
FIG. 1 is a block diagram of circuits on an integrated circuit die, according to one embodiment.

FIG. 1 is a block diagram of circuits on an integrated circuit die 20 according to one embodiment. The integrated circuit die 20 includes supply voltages 22 coupled to a threshold detector 24 and control circuit 26. The control circuit 26 is coupled to the threshold detector 24. A semiconductor doped well region 30 is coupled to the threshold detector 24.

In one embodiment, the voltage supply 22 outputs a high supply voltage VDD and ground GND. The high supply voltage VDD and the low supply voltage ground are provided to the threshold detector 24 and the control circuit 26.

The threshold detector 24 detects whether a temperature of the semiconductor doped well region 30 is higher or lower than a threshold temperature. The threshold detector 24 outputs either VDD or ground to the semiconductor doped well region 30 depending on whether the temperature of the semiconductor doped well region is higher or lower than the threshold temperature.

The semiconductor doped well region 30 includes the body regions of a plurality of transistors of the integrated circuit die 20. The conductive properties of the transistors are affected by a temperature of the body region. In particular, the threshold voltages of PMOS and NMOS transistors change with temperature. In low voltage applications, for example VDD<1V, small changes in the threshold voltages can result in large changes in the function of the integrated circuit die 20.

The threshold voltages of PMOS and NMOS transistors can be also adjusted by adjusting bias voltages applied to the body regions of the transistors. Thus, in order to counteract the effects of temperature change in the semiconductor doped well region 30, the threshold detector 24 selectively applies bias voltages to the semiconductor doped well region 30 based on the temperature of the semiconductor doped well region 30.

In one embodiment, the integrated circuit die includes an SRAM array made up of transistors having body regions in the semiconductor doped well region 30. In a low-voltage application the SRAM array will function poorly at low temperatures if all other factors remain the same. Accordingly, when the temperature of the doped well region 30 is below a threshold temperature, the threshold detector 24 applies VDD to the semiconductor doped well region 30 to improve its performance. Likewise, at high temperatures the SRAM array will function poorly if a high voltage is applied to the semiconductor doped well region 30. Accordingly, when the temperature of the doped well region 30 is above the threshold temperature, the threshold detector 24 applies ground voltage to the semiconductor doped well region 30 to improve its performance. By selectively applying bias voltages to the semiconductor doped well region 30 based on a threshold temperature, the SRAM array can function well at both high and low temperatures.

In one example, the threshold temperature is about 0° C. Accordingly, the threshold detector 24 applies VDD to the semiconductor doped well region 30 when the temperature of the semiconductor doped well region 30 is below 0° C. The threshold detector 24 applies ground voltage to the semiconductor doped well region 30 when the temperature of the semiconductor doped well region 30 is above 0°. Other values for the threshold temperature can be used as taught in the present disclosure, as can other values to apply to the well region 30.

The principles of the present disclosure can be extended to many other applications other than transistors of an SRAM array, as will be apparent to those of skill in the art in light of the present disclosure. All such other applications fall within the scope of the present disclosure.

Figure 2:
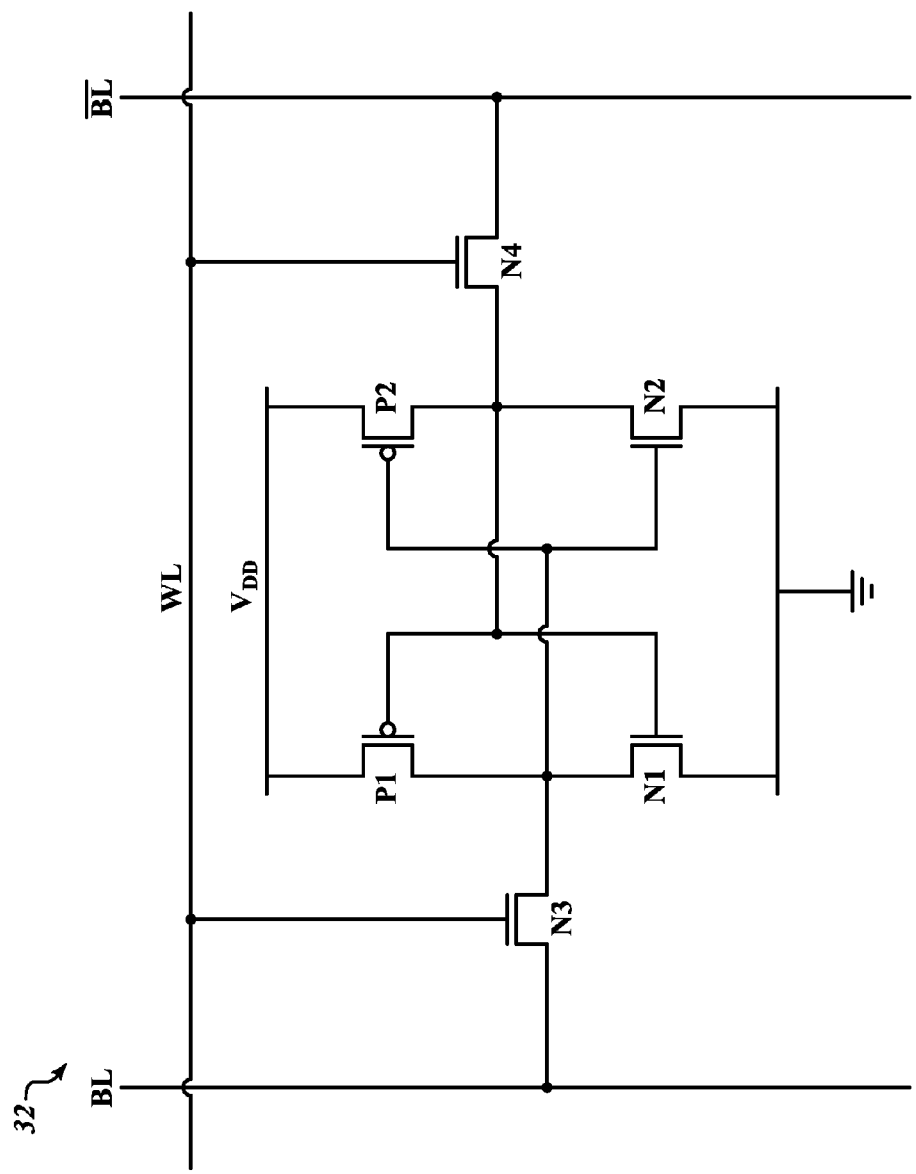
FIG. 2 is a schematic diagram of an SRAM bit cell, according to one embodiment.
Figure 3:
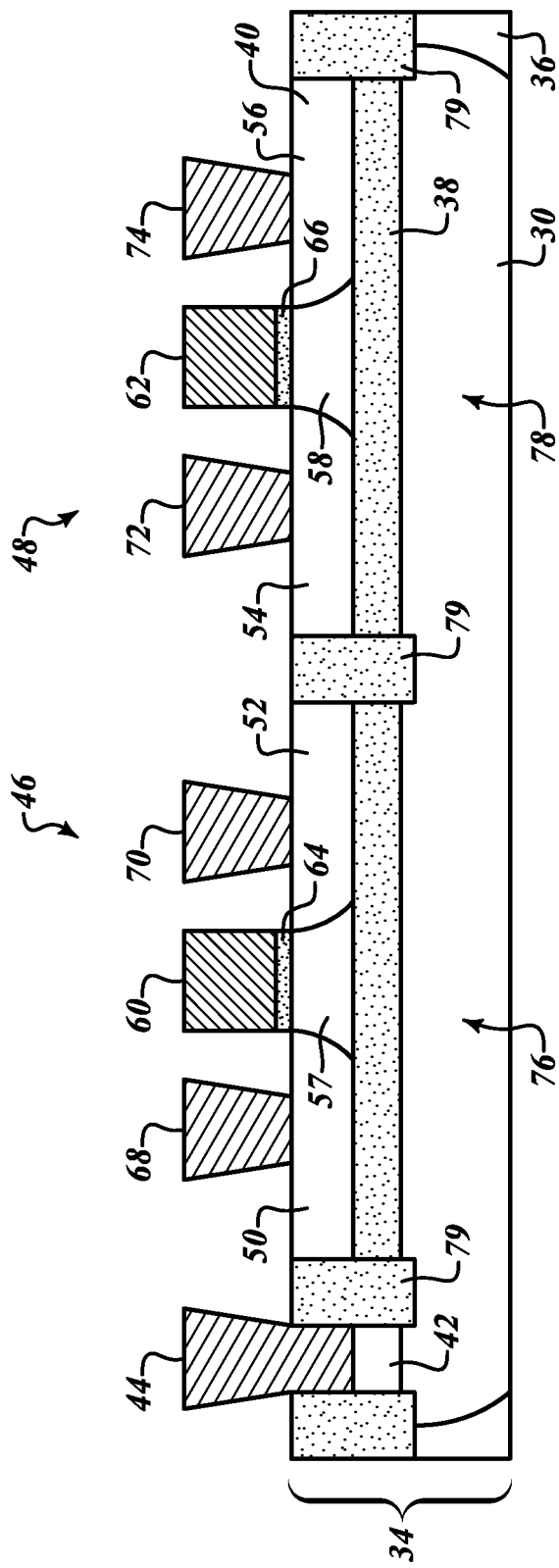
FIG. 3 is a cross section of an integrated circuit die including a semiconductor substrate and transistors, according to one embodiment.

FIG. 2 is a schematic diagram of an SRAM bit cell 32 of an SRAM array implemented in an integrated circuit die 20. Though not shown in FIG. 1, the integrated circuit die 20 includes an operating circuit, such as the SRAM 32, together with the threshold detector 24 as described with reference to FIG. 1 and a fully depleted silicon on insulator (FDSOI) substrate. FIG. 3 is a cross-section of the integrated circuit die illustrating the doped well region 30 in the FDSOI substrate. FIGS. 2 and 3 illustrate an example of one application of principles of the present disclosure that would be used on a circuit on die 20.

The SRAM bit cell 32 includes two PMOS transistors, P1, P2, and four NMOS transistors, N1-N4. The transistors P1, N1, form a first inverter. The transistors N2, P2 form a second inverter. The first and second inverters are cross-coupled together such that the output of each inverter is coupled to the input of the other inverter. The transistors N3, N4 are access transistors having their gates coupled to the word line WL. The access transistors couple the bit lines BL to the respective outputs of the inverters. The source terminals of the PMOS transistors P1, P2 are coupled to the supply voltage $V_{DD}$. The source terminals of the transistors N1, N2 are coupled to ground.

During a read operation of the bit cell 32, the bit lines BL are precharged to an intermediate voltage level between $V_{DD}$ and ground. $V_{DD}$ is then applied to the word line WL, thereby enabling the access transistors N3, N4 and coupling the bit lines BL to the respective outputs of the inverters. A small voltage difference will develop between the bit lines BL. This voltage difference is magnified by a sense amplifier (not shown), thereby enabling read circuitry to reliably recognize the difference between the voltages on the bit lines, and thus read the data stored in the SRAM bit cell 32.

During a write operation of the bit cell 32, the bit line BL is brought high while the other bit line BL is brought low, depending upon the data to be written to the SRAM bit cell 32. The word line WL is then brought high, thereby coupling the inputs of the inverters of the bit cell 32 to a respective bit line BL, thereby forcing the cross-coupled inverters into a stable state in which the output of one of the inverters is high while the input of the other inverter is low.

As described previously, in a conventional SRAM array high and low temperatures can adversely affect the reliability of read and write operations, particularly at low operating voltage. However, in an SRAM implemented in conjunction with an FDSOI substrate and with the body bias generator 22 and the threshold detector 24, reliability of read and write operations can be enhanced at high and low temperatures with respect to conventional SRAM arrays.

FIG. 3 is a cross section of the integrated circuit die 20 including an FDSOI substrate 34. The FDSOI substrate 34 includes a first layer of semiconductor material 36, a buried oxide layer (BOX) 38 directly on top of the first layer of semiconductor material 36, and a second layer of semiconductor material 40 directly on top of the BOX layer 38. The doped well region 30, for example lightly doped with P-type donor atoms, is formed in the first layer of semiconductor material 36. A highly doped body contact 42 is positioned on the doped well region 30. A body contact plug 44 is coupled to the highly doped body contact region 42, by which the body bias voltage can be applied to the doped well region 30. An NMOS transistor 46, for example one of the NMOS transistors N1-N4 of the SRAM bit cell is formed in conjunction with the FDSOI semiconductor substrate 34. A PMOS transistor 48, for example one of the PMOS transistors P1, P2 of the SRAM bit cell 32, is formed in conjunction with the FDSOI semiconductor substrate 34. N-type source and drain regions 50, 52 of the NMOS transistor 46 are formed in the second layer of semiconductor material 40. P-type source and drain regions 54, 56 of the PMOS transistor 48 are formed in the second layer of semiconductor material 40. A channel region 57 of the NMOS transistor 46 is positioned between the source and drain regions 50, 52 in the second layer of semiconductor material 40. A channel region 58 of the PMOS transistor 48 is positioned between the source and drain regions 54, 56 in the second layer of semiconductor material 40. A gate dielectric 64 of the NMOS transistor 46 is positioned over the channel region 57. A gate electrode 60 of the NMOS transistor 46 is positioned on the gate dielectric 64. A gate dielectric 66 of the PMOS transistor 48 is positioned on the channel region 48. A gate electrode 62 of the PMOS transistor is positioned on the gate dielectric 66. Source and drain contact plugs 68, 70 are positioned on the source and drain regions 50, 52. Source and drain contact plugs 72, 74 are positioned on the source and drain regions 54, 56 of the PMOS transistor 48. The body regions 76, 78 of the transistors 46, 48 are positioned in the first layer of semiconductor material 36, and more particularly within the doped well region 30. Trench isolation regions 79, for example of silicon dioxide, are positioned in the FDSOI substrate 34.

In one embodiment, the first layer of semiconductor material 36 is monocrystalline silicon between 10 and 30 nm thick. The BOX layer 38 is silicon dioxide between 10 and 25 nm thick. The second layer of semiconductor material 40 is monocrystalline silicon between 5 and 8 nm thick. Alternatively, other semiconductor materials and dielectric materials can be used for the first and second layers of semiconductor material 36, 38 and the BOX layer 40.

Because the second layer of semiconductor material 40 is very thin, the entire thickness of the second layer of semiconductor material 40 in the channel regions 54 and 58 becomes fully depleted when the transistors 46, 48 are enabled. Thus, the body regions 76, 78 of the transistors 46, 48 are positioned in the doped well region 30.

The body bias voltage can be applied to the doped well region 30 by applying the body bias voltage to the body contact plug 44. Because the body contact region 42 is highly doped, the body bias voltage is transferred from the body contact plug 44 to the doped well region 30.

In one embodiment, the threshold detector 24 selectively applies VDD or ground to the doped well regions based on the temperature of the semiconductor substrate 34. The threshold voltages of the transistors 46, 48 are based, in part, on the voltage to be applied to the doped well region 30.

Figure 4:
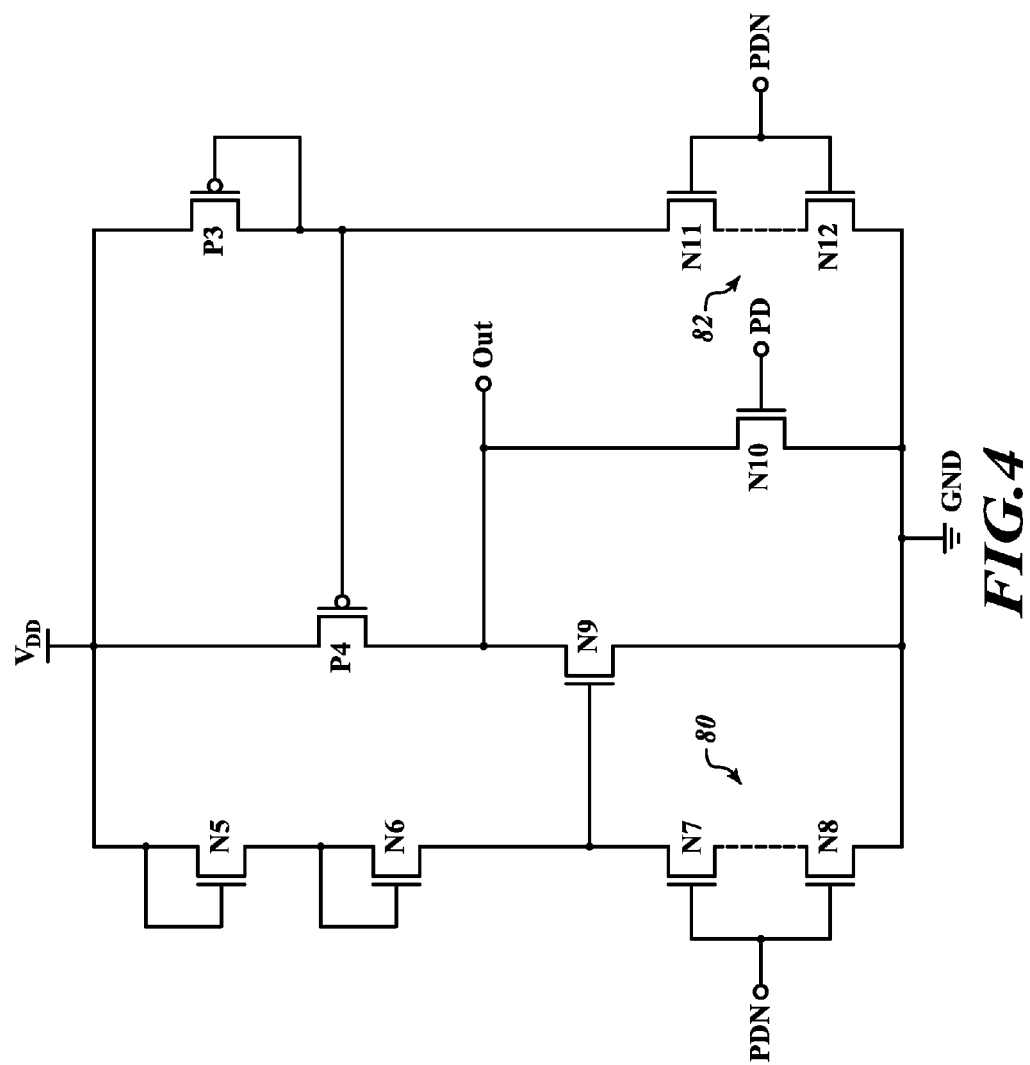
FIG. 4 is a schematic diagram of a temperature detection circuit according to one embodiment.

FIG. 4 is a schematic diagram of the threshold detector 24, according to one embodiment. The threshold detector 24 includes a first NMOS transistor N5 having a drain terminal coupled to VDD. The drain terminal of the transistor N5 is coupled to the gate terminal of the transistor N5. A second NMOS transistor N6 is connected in series with the transistor N5. In particular, the drain terminal of the transistor N6 is connected to the source terminal of the transistor N5 and to the gate terminal of the transistor N6. The source terminal of the transistor N6 is coupled to the drain terminal of the transistor N7 and to the gate terminal of the transistor N9. The transistors N7 and N8 are connected in series as a current source 80. The dashed lines between N7 and N8 indicate that there are multiple other NMOS transistors, for example 10 or more, coupled in series between N7 and N8 as part of the current source 80. All the gate terminals of the current source 80 are connected to a voltage PDN. A PMOS transistor P3 has a source terminal connected to VDD and a drain terminal connected to the drain terminal of a transistor N11. The transistors N11 and N12 are connected in series as a current source 82. The dashed lines between N11 and N12 indicate that there are multiple other NMOS transistors, for example 10 or more, coupled in series between N11 and N12 as part of the current source 82. All the gate terminals of the current source 82 are connected to a voltage PDN. The drain terminal of the transistor P3 is also connected to the gate terminal of the transistor P4. The source terminal of the transistor P4 is coupled to VDD. The drain terminal of the transistor P4 is coupled to the output node Out. The drain terminal of the transistor N9 is also coupled to the output node Out. The source terminal of the transistor N9 is coupled to ground. A transistor N10 is coupled between Out and ground. In particular, the drain terminal of the transistor N10 is coupled to Out. The source terminal of the transistor N10 is coupled to ground. The gate terminal of the transistor N10 receives a control signal PD, of which PDN is the logical opposite.

The threshold detector 24 utilizes the principle that the threshold voltages of CMOS transistors vary with temperature. In particular, the threshold detector 24 effectively amplifies the change in the threshold voltage in order to force Out to receive VDD when the temperature of the semiconductor substrate is below the threshold voltage and to receive ground voltage when the temperature of the semiconductor substrate is above the threshold voltage. Thus, by utilizing the change in threshold voltage, the threshold detector 24 can output a body bias voltage that changes based on a threshold temperature.

The threshold detector 24 outputs either VDD or ground based in part on the gate voltages of the transistors N9 and P4. As the gate voltage on the transistor N9 increases, the transistor N9 becomes more strongly conductive which tends to drive Out towards ground. As the gate voltage on the transistor P4 increases, the transistor P4 becomes less conductive, thereby shielding the output Out from VDD. As the gate voltage on the transistor N9 decreases, the transistor N9 becomes less conductive, thereby shielding Out from ground. As the gate voltage on the transistor P4 decreases, the transistor P4 becomes more conductive, thereby driving the output toward VDD. In this manner the threshold detector 24 outputs either ground or VDD.

An example of operation of the threshold detector 24 will now be given, according to one embodiment. At a temperature of −40° C. with the current sources enabled (PDN=VDD) and driving a current Iref, the transistors N5, N6, and P3 are all conductive. The voltage on the source terminal of the transistor N5 is VDD−$V_{Th}$, where $V_{Th}$ is the threshold voltage of the NMOS transistors of the threshold detector 24. As the temperature of the semiconductor substrate increases, the threshold voltage $V_{Th}$ decreases. As the threshold voltage $V_{Th}$ decreases, the voltage on the source terminal of the transistor N5 increases. This is because the current source 80 drives a fixed current through the transistor N5 and the current in an NMOS transistor is based on the overdrive voltage $V_{GS}$-$V_{Th}$. Thus, if $V_{Th}$ changes but the current remains the same then the gate to source voltage $V_{GSN5}$ will also change. But because the gate voltage of the transistor N5 is fixed at VDD, the source voltage of N5 is forced to increase according to the decrease in the threshold voltage $V_{Th}$. Thus, as the temperature increases, the change in the voltage on the source terminal of the transistor N5 is equal to −$\Delta V_{Th}$, where $\Delta V_{Th}$ is the change in threshold voltage.

The voltage at the source terminal of the transistor N6 increases at double the rate that the voltage at the source of N5 changes. As the current source 80 drives a fixed current through N6, the overdrive voltage $V_{OV}$ ($V_{GSN6}$-$V_{Th}$) remains the same. But because $V_{Th}$ has decreased $\Delta V_{Th}$ and $V_{GN6}$ has increased (because $V_{SN5}$ has increased), $V_{SN6}$ must increase −2$\Delta V_{Th}$ in order for $V_{OV}$ to remain constant. Because $V_{GN6}$ is equal to $V_{SN5}$, the change in voltage $V_{SN6}$ is equal to −2$\Delta V_{Th}$. Thus the series configuration of N5, N6 and the current source 80 amplify the effect of $\Delta V_{Th}$ by a factor of 2 at the source of N6. Because the gate terminal of the transistor N9 is coupled to the source terminal of the transistor N6, the change in the gate voltage $V_{GN9}$ is equal to −2$\Delta V_{Th}$. Thus, $V_{GN9}$ increases at twice the absolute value of $\Delta V_{Th}$ as temperature increases.

The effect of the change in $V_{Th}$ with temperature is further amplified within the transistor N9. The drain current of an NMOS transistor increases according to $V_{OV}$ ($V_{GS}$-$V_{th}$). For the transistor N9, the gate voltage $V_{GN9}$ has increased by $-2\Delta V_{Th}$ while the source voltage remains fixed at 0 V. Thus the change in $V_{OVN9}=-2\Delta V_{Th}-\Delta V_{Th}=-3\Delta V_{Th}$. Thus, for a decrease in $V_{Th}$, the $V_{OVN9}$ increases by a factor of 3. Thus, the conductivity of the transistor N9 increases greatly with a decrease in $V_{Th}$. As the conductivity of the transistor N9 increases with increasing temperature, the transistor N9 comes closer to driving the Vout towards ground.

The voltage at Out is also based on the conductivity of the transistor P4. At very low temperatures the transistor P4 is highly conductive, thereby supplying VDD to Out. As the temperature increases, so does the threshold voltage $V_{TP}$ of the PMOS transistors. The gate terminal of the transistor P4 is coupled to the drain terminal of the transistor P3, which is in turn coupled to the gate terminal of the transistor P3. The current source 82 drives a fixed current through the transistor P3. In order for the $V_{OV}$ ($V_{SG}$+$V_{TP}$, where $V_{TP}$ is a negative value that increases towards zero with increasing temperature) of P3 to remain the same as $V_{TP}$ increases with temperature, $V_{GP3}$ will increase at the same rate as $V_{TP}$. Because the gate terminal of P4 is coupled to the gate terminal of P3, the change in voltage on the gate terminal of P4 is equal to $\Delta V_{TP}$. Thus, as the temperature increases so do $V_{GP3}$ and $V_{GP4}$. The overdrive voltage $V_{OV}$ of the transistor P4 does not increase with temperature. In fact, the overdrive voltage $V_{ov}$ of P4 decreases slightly with temperature. Thus, while the overdrive voltage $V_{ov}$ of N9 increases in an amplified manner with increasing temperature, the overdrive voltage $V_{OV}$ of P4 decreases gradually.

As temperature increases, eventually $V_{OV}$ of the transistor N9 becomes sufficiently large, and $V_{OV}$ of P4 sufficiently small, that the output node transitions from VDD to ground. The temperature at which this transition occurs is the threshold temperature. In the same manner, as the temperature decreases toward the threshold temperature the output voltage Vout transitions from ground to VDD when $V_{OVN9}$ becomes sufficiently small and $V_{OVP4}$ sufficiently large.

The transistor N10 can be utilized to force the output voltage to ground. In particular, when the signal PD is a high value (VDD) the transistor N10 is enabled and the Out is coupled to ground through N10. Likewise, when PD is at VDD, PDN is at ground, thereby disabling the current sources 80, 82 which in turn disables the transistor P4, thereby disconnecting Out from VDD.

Figure 5:
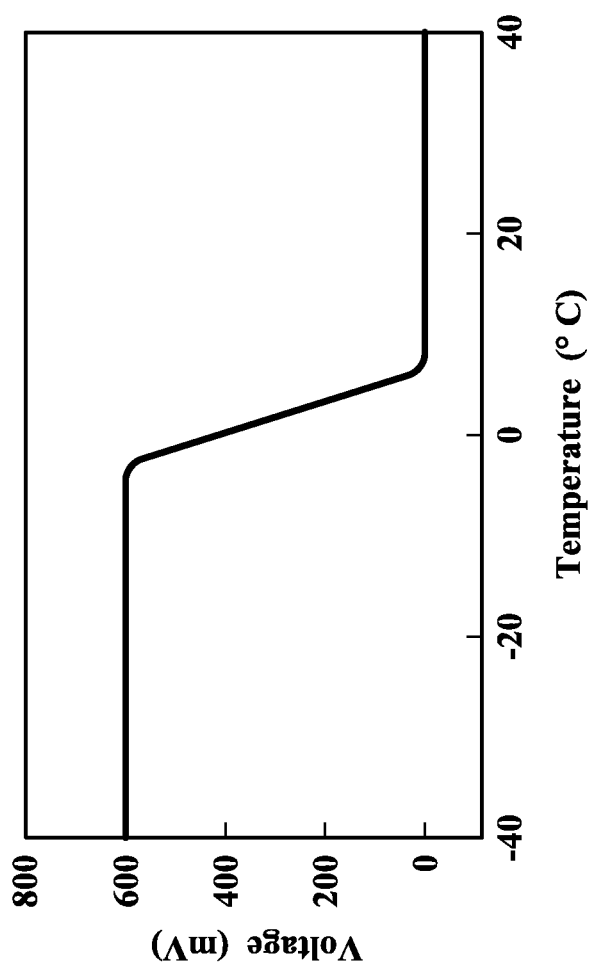
FIG. 5 is a graph illustrating the output voltage of the temperature detection circuit temperature, according to one embodiment.

FIG. 5 is a graph of the output voltage Vout of the threshold detector 24 vs. Temperature, according to one embodiment. In the example of FIG. 5 VDD equals 600 mV. At −40° C. the output voltage is at 600 mV. The output voltage V out remains steady at 600 mV as the temperature increases. The temperature increases until the temperature approaches the threshold temperature of about 0° C. at which point the output voltage decreases towards 0 V. Thus, there is a transition period during which the output voltage transitions from VDD to ground as temperature increases, or from ground to VDD as temperature decreases.

Similarly, as the temperature decreases from 40° C., the output voltage remains at 0 V until the temperature approaches the threshold temperature of about 0° C. As the temperature decreases near the threshold temperature, the output voltage transitions to 600 mV.

The threshold temperature can be selected based to be different values based on dopant concentrations, width to length ratios, and differing circuit configurations. Those of skill in the art will understand that the threshold temperature and circuit configuration set forth above is given only by way example, and that other threshold temperatures can be selected in accordance with principles of the present disclosure. For example, the threshold temperature can be set at 20° C. or 30° C. depending on the needs of the circuit to be driven by control circuit 26 or threshold detector 24. Also, the voltage to be applied to the well 30 can be selected for each circuit. For some circuits, the well voltage may vary from 0 volts for a low to a high of 50% of VDD, while in others, it might be 20% of VDD. The range of variations of the well voltage will be selected based on the type of circuit that is on the die 20.

Figure 6A:
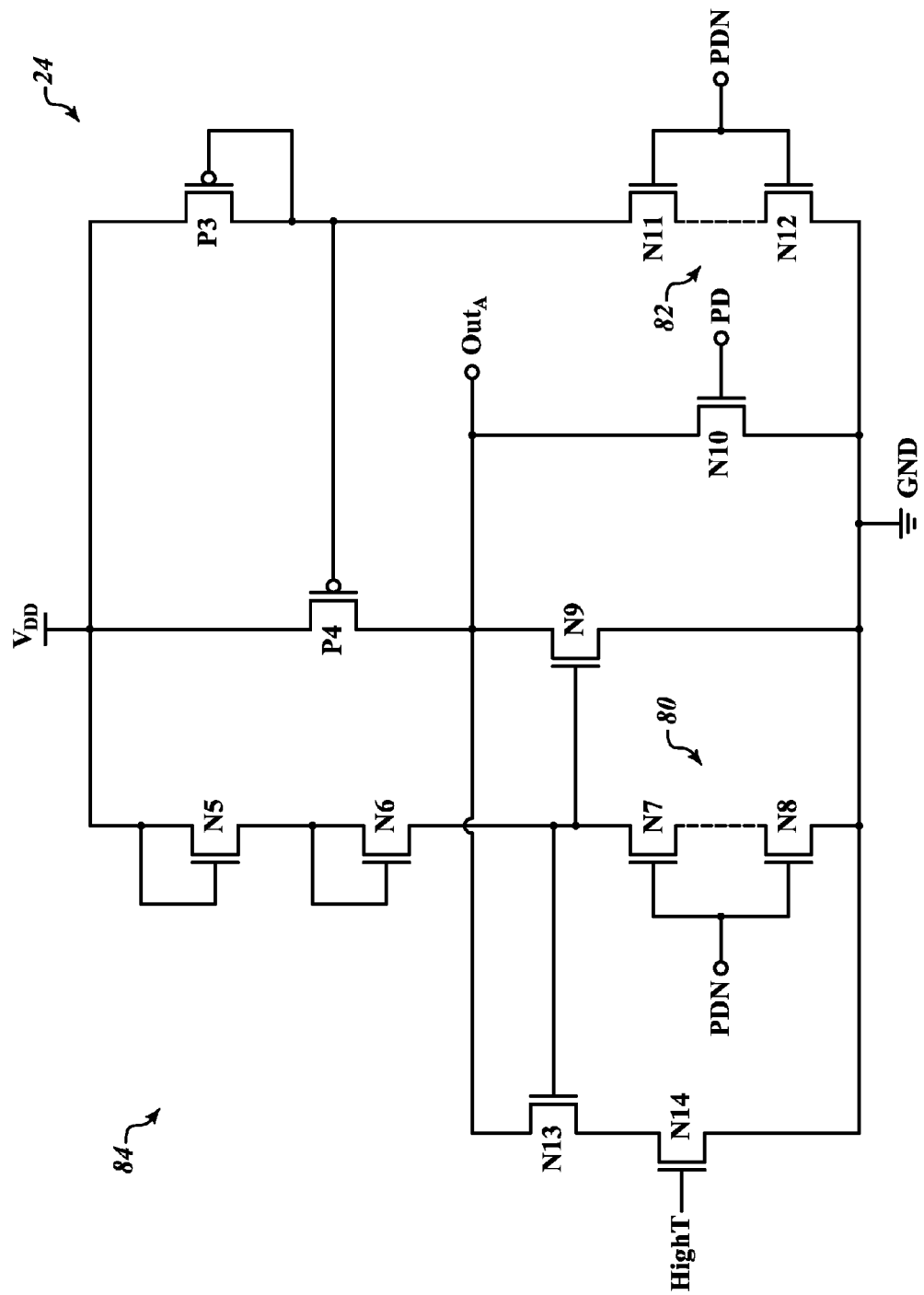
FIG. 6A is a schematic diagram of a temperature detection circuit according to one embodiment.
Figure 6B:
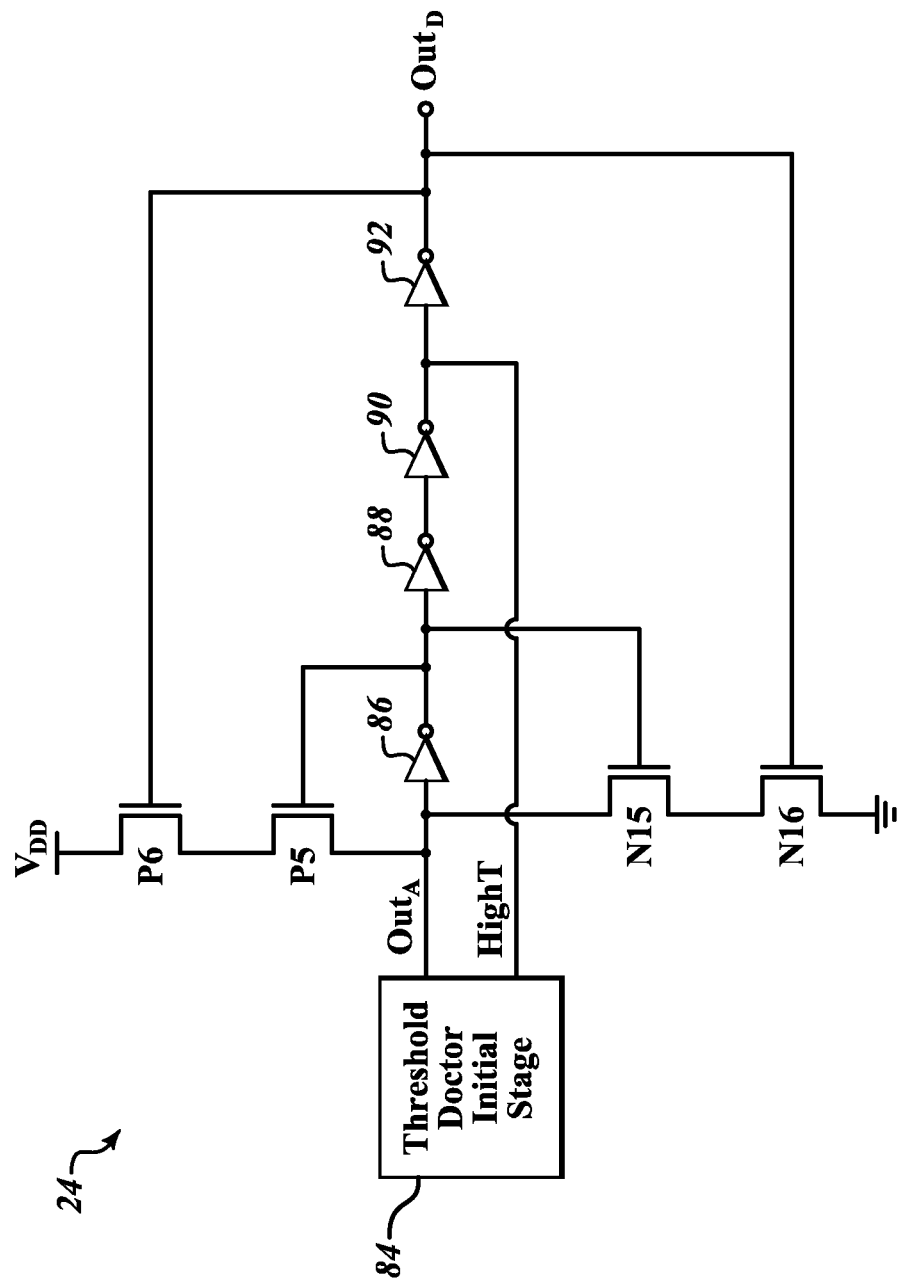
FIG. 6B is a schematic diagram of a temperature detection circuit according to one embodiment.

FIGS. 6A and 6B are schematic diagrams of threshold detector 24 that includes hysteresis effects and a sharper transition at the threshold temperature.

FIG. 6A is a schematic diagram of an initial stage 84 of the threshold detector 24, according to one embodiment. The threshold detector initial stage 84 is substantially similar to the threshold detector 24 of FIG. 4. However, the threshold detector initial stage 84 of FIG. 6A includes additional transistors N13, N14 which help to introduce a hysteresis effect. The gate terminal of the transistor N13 is coupled to the gate terminal of the transistor N9. The drain terminal of the transistor N13 is coupled to OutA, the output of the threshold detector initial stage. The transistor N14 is coupled between N13 and ground.

The gate terminal of the transistor N14 receives a control signal High T. The control signal High T is the logical opposite of the overall output OutD of the threshold detector (shown in FIG. 6B). Thus, when the temperature is low and increasing toward the threshold temperature, High T is at ground and has no effect on the operation of the initial stage 84 as compared to the embodiment of FIG. 4. However, when the temperature is high and decreasing toward the threshold temperature, High T is at VDD, thereby enabling the transistor N14 and allowing the transistor N13 to couple OutA to ground. With both N13 and N9 coupling OutA to ground, the temperature must decrease somewhat beyond the threshold temperature before OutA can be decoupled from ground and driven to VDD. Thus, there are two threshold temperatures. A first threshold temperature for transitioning from VDD to ground, and a second threshold temperature for transitioning from ground to VDD. This effect can be seen in the graph of FIG. 7. After OutA transitions to VDD, High T goes low and the operation of the initial stage 84 reverts to that of the embodiment of FIG. 4.

FIG. 6B is a schematic diagram of the threshold detector 24 including the initial stage 84, according to one embodiment. In particular, a series of inverters 86, 88, 90, and 92 are coupled together between the output OutA of the initial stage 84 and the final output OutD of the threshold detector 24. PMOS transistors P6, P5 are coupled together in series between VDD and OutA. The gate terminal of the transistor P5 is coupled to the output of the inverter 86. The gate terminal of the transistor P6 is coupled to the output of the inverter 92. NMOS transistors N15, N16 are coupled in series between Out and ground. The gate terminal of N15 is coupled to the output of the inverter 86. The gate terminal of the transistor N16 is coupled to the output of the inverter 92. The control voltage High T is generated between the inverters 90, 92.

When the temperature increases toward the threshold temperature, OutA begins to transition toward ground. As the output OutA transitions from VDD to ground a transient response occurs in the inverters 86-92 which will cause the transistors N15, N16 to temporarily be enabled at the same time. With N15, N16 enabled OutA is pulled quickly to ground. In this way, the transition between VDD and ground occurs much more quickly than in FIG. 5. This sharp transition can be seen in FIG. 7. When OutA transitions to ground, OutD is quickly pulled to ground via the inverters 86-92. OutD supplies the body bias voltage to the semiconductor doped well region 30. With OutD at ground, High T is brought to VDD and the hysteresis effect is enabled in the initial stage 84 as described in relation to FIG. 6A.

In a similar way, as the temperature of the semiconductor substrate decreases toward the high-to-low threshold temperature as determined by High T, OutA will initially be at ground voltage. As the output OutA transitions from ground to VDD a transient response occurs in the inverters 86-92 which will cause the transistors P5, P6 to temporarily be enabled at the same time. With P5, P6 enabled OutA is pulled quickly to VDD. In this way, the transition ground to VDD occurs much more quickly than in FIG. 5. This sharp transition can be seen in FIG. 7 as explained later herein. When OutA transitions to VDD, OutD is quickly pulled to VDD via the inverters 86-92. With OutD at VDD, High T is brought to ground and the hysteresis effect is enabled in the initial stage 84 as described in relation to FIG. 6A.

This hysteresis effectively provides two threshold temperatures, a low-to-high threshold temperature for transitions in the body bias voltage from VDD to ground, and a high-to-low threshold temperature for transitions in the body bias voltage from ground to VDD. In particular, as the temperature of the semiconductor substrate increases to the low-to-high threshold temperature the output voltage will quickly transition from VDD to ground. However, as the temperature of the semiconductor substrate decreases the output voltage will not transition from ground to VDD until the temperature surpasses the low-to-high threshold and reaches the high-to-low threshold temperature, at which point the output voltage rapidly transitions from ground to VDD.

Figure 7:
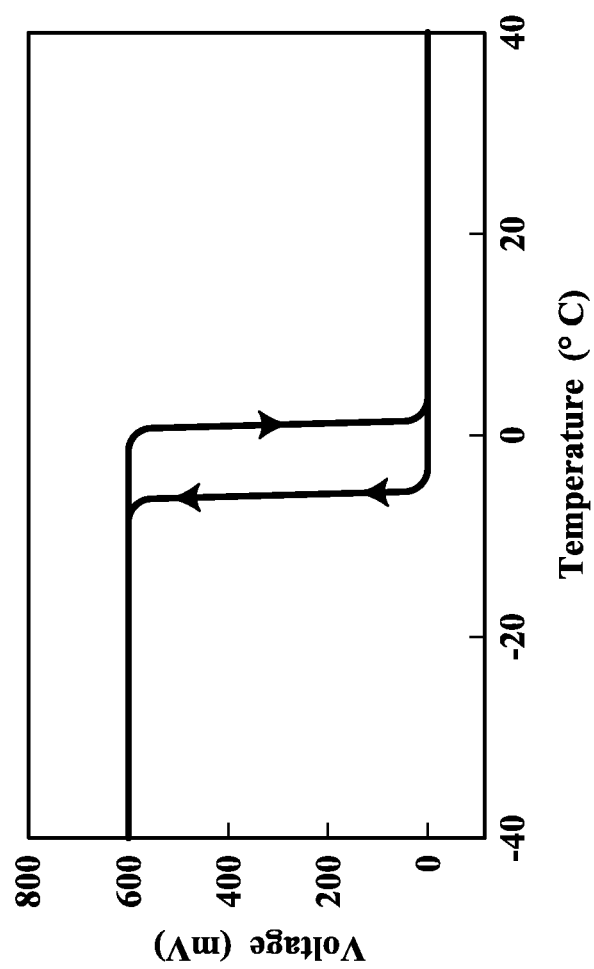
FIG. 7 is graph illustrating the output voltage of the temperature detection circuit temperature, according to one embodiment.

FIG. 7 is a graph of the output voltage $Out_A$ of FIG. 6B of the threshold detector 24 of FIGS. 6A, 6B versus temperature, according to one embodiment. The use of transistors P5, P6, coupled with transistors N15 and N16, assist to make the transitions on OutA sharp, namely, having a short rise and fall time. As can be seen, as the temperature increases from −40° C. toward the low-to-high threshold temperature of about −5° C., the output voltage remains steady at 600 mV. When the low-to-high threshold temperature is reached, the output voltage drops rapidly to 0 V. As the temperature decreases from 0° C. toward the high-to-low threshold temperature, the output voltage remains steady at 0 V at the low-to-high threshold temperature until the temperature reaches the high-to-low threshold temperature, at which point the output voltage sharply increases from 0 V to 600 mV. Thus, hysteresis and sharper transitions have been introduced into the threshold detector 24.

Figure 8:
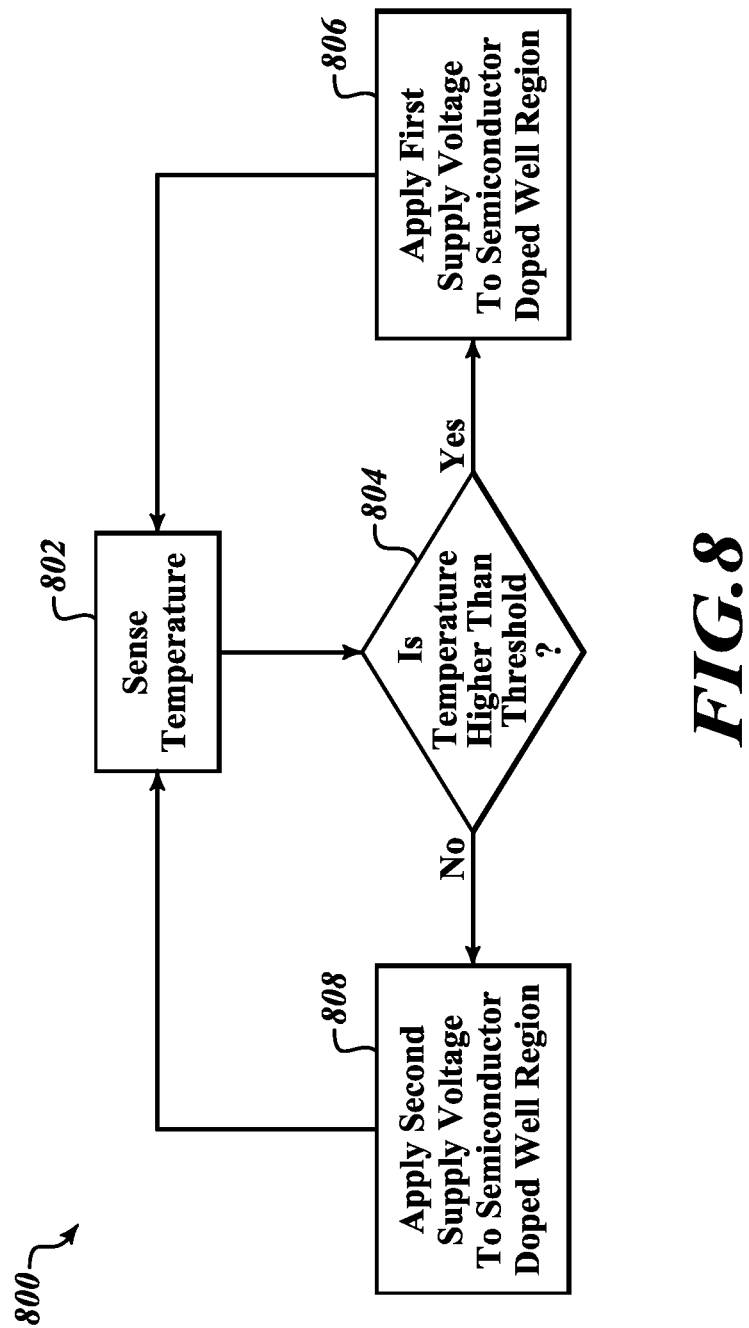
FIG. 8 is a flow diagram of a process for selectively applying a bias voltage to a semiconductor doped well region based on temperature, according to one embodiment.

FIG. 8 is a flow diagram of a process 800 for selectively applying a body bias voltage to a doped well region of a semiconductor substrate based on the threshold temperature, according to one embodiment. In particular, at 802 the temperature of the semiconductor substrate is sensed. At 804 if the temperature is greater than a threshold temperature the process proceeds to 806. If the temperature is not higher than the threshold temperature the process proceeds to 808. At 806 the first supply voltage is applied to the semiconductor doped well region. At 808 the second supply voltage is applied to the semiconductor doped well region. In this way, either a first or a second supply voltage is applied to semiconductor doped well region based on whether the temperature is higher or lower than a threshold temperature.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit die comprising:
   a semiconductor substrate;
   a doped well region in the semiconductor substrate;
   a plurality of transistors having body regions positioned in the doped well region;
   a threshold detector that senses a temperature of the semiconductor substrate and applies a first bias voltage to the doped well region if the temperature is above a threshold temperature and applies a second bias voltage to the doped well region if the temperature is below the threshold temperature; and
   an output terminal that supplies the first or second bias voltage to the doped well region based on the temperature;
   a first NMOS transistor having a drain terminal connected to the output terminal; and
   a first PMOS transistor having a drain terminal connected to the output terminal.

2. The integrated circuit die of claim 1 wherein the plurality of transistors include a bit-cell of an SRAM memory array.

3. The integrated circuit die of claim 2 wherein the first bias voltage is ground and the second bias voltage is a positive supply voltage of the integrated circuit die.

4. The integrated circuit die of claim 1 wherein the threshold detector senses the temperature based on a change in a threshold voltage of one or more MOS transistors.

5. The integrated circuit of claim 1 wherein the threshold detector includes a first current path including:
   a first current source configured to generate a first current;
   a second NMOS transistor that passes the first current; and
   a third NMOS transistor having a drain terminal coupled to a source terminal of the second NMOS transistor and that passes the first current, a source terminal of the third NMOS transistor being coupled to a gate terminal of the first NMOS transistor.

6. The integrated circuit die of claim 5 wherein a change in temperature causes a change in a gate voltage of the first NMOS transistor that is twice as large as a change in a threshold voltage of the second NMOS transistor.

7. The integrated circuit of claim 5 further including:
   a plurality of transistors comprising N number of NMOS transistors coupled in series with each other and having the gate terminal of the first NMOS transistor coupled to the drain of one of the transistors in the series to cause a voltage change of $N*V_{Th}$ on the gate of first NMOS transistor as the temperature changes.

8. The integrated circuit die of claim 5 wherein the threshold detector includes a second current path including:
   a second current source configured to generate a second current; and
   a second PMOS transistor that passes the second current, the second PMOS transistor having a drain terminal and a gate terminal coupled to a gate terminal of the first PMOS transistor.

9. The integrated circuit die of claim 5 wherein the threshold detector includes a fourth NMOS coupled to the first current path, the fourth NMOS transistor having a gate terminal that receives a logic signal that causes a hysteresis effect in the threshold temperature.

10. The integrated circuit die of claim 1 wherein the threshold detector comprises:
    a second output; and
    a plurality of inverters coupled in series between the first output and the second output.

11. The integrated circuit die of claim 1 wherein the semiconductor substrate is an FDSOI semiconductor substrate comprising:
    a first layer of semiconductor material including the doped well region;
    a layer of dielectric material positioned on the first layer of semiconductor material; and
    a second layer of semiconductor material positioned on the layer of dielectric material, channel regions of the transistors being positioned in the second layer of semiconductor material.

12. A method comprising:
    applying a first body bias voltage to a doped well region of a semiconductor substrate when a temperature of the semiconductor substrate is below a first threshold temperature, body regions of a plurality of transistors being positioned in the semiconductor substrate;
    applying a second body bias voltage to the doped well region when the temperature of the semiconductor substrate increases beyond the first threshold temperature; and
    applying, after the applying the second body bias voltage to the doped well region, the first body bias voltage to the doped well region when the temperature of the semiconductor substrate decreases below a second threshold temperature lower than the first threshold temperature.

13. The method of claim 12 comprising applying, after the applying the second body bias voltage to the doped well region, the first body bias voltage to the doped well region when the temperature of the semiconductor substrate decreases below the first threshold temperature.

14. The method of claim 12 comprising detecting that the temperature has increased beyond the threshold temperature based on a change in a threshold voltage of one or more MOS transistors.

15. The method of claim 14 wherein the first body bias voltage is a positive supply voltage and the second body bias voltage is ground.

16. A device comprising:
    a semiconductor substrate including:
       a first layer of semiconductor material having a doped well region;
       a buried dielectric layer positioned on the first layer of semiconductor material; and
       a second layer of semiconductor material positioned on the buried dielectric layer;
    a plurality of array transistors having:
       body regions positioned in the doped well region; and
       channel regions positioned in the second layer of semiconductor material;
    a threshold detector that outputs a first body bias voltage to the doped well region when a temperature of the semiconductor substrate is below a first threshold temperature, outputs a second body bias voltage to the doped well region when the temperature increases beyond the first threshold temperature and after the threshold detector outputs the second body bias voltage to the doped well region, the threshold detector outputs the first body bias voltage to the doped well region when the temperature of the semiconductor substrate decreases below a second threshold temperature lower than the first threshold temperature.

17. The device of claim 16 wherein the first body bias voltage is a high supply voltage and the second body bias voltage is ground.

* * * * *